(12) United States Patent  
Kresh et al.

(10) Patent No.: US 6,918,100 B2  
(45) Date of Patent: Jul. 12, 2005

(54) HIERARCHICAL EVALUATION OF CELLS

(75) Inventors: Kobi Kresh, Portland, OR (US); Phillip A. Brooks, Tualatin, OR (US)

(73) Assignee: Mentor Graphics Corp., Wilsonville, OR (US)

( * ) Notice: Subject to any disclaimer, the term of this patent is extended or adjusted under 35 U.S.C. 154(b) by 67 days.

(21) Appl. No.: 10/404,907

(22) Filed: Mar. 31, 2003

(65) Prior Publication Data

US 2004/0199880 A1 Oct. 7, 2004

(51) Int. Cl.$^7$ .............................................. G06F 17/50
(52) U.S. Cl. .................................. 716/4; 716/3; 716/5
(58) Field of Search ...................................... 716/4, 3, 5

(56) References Cited

U.S. PATENT DOCUMENTS 5,790,416 A  *  8/1998  Norton et al. ................. 716/11
5,805,860 A  *  9/1998  Parham ........................ 716/12

OTHER PUBLICATIONS

L. G. Jones, "Fast batch incremental netlist compilation hierarchical schematics", Computer–Aided Design of Integrated Circuits and Systems, IEEE Transactions on, vol.: 10, Issue: 7, Jul. 1991 pp.: 922–931.*

Kim et al., "Hierarchical LVS based on hierarchy rebuilding", Design Automation Conference 1998. Proceedings of the ASP–DAC '98. Asia and South Pacific, Feb. 10–13, 1998 pp.: 379–384.*

Batra et al, "Hcompare: a hierarchical netlist comparison program", Design Automation Conference, 1992. Proceedings., 29th ACM/IEEE, Jun. 8–12, 1992 pp.: 299–304.*

* cited by examiner

Primary Examiner—Leigh M. Garbowski
Assistant Examiner—Brandon Bowers
(74) Attorney, Agent, or Firm—Banner & Witcoff, Ltd.

(57) ABSTRACT

A technique is provided for determining a hierarchical effectiveness for a cell in a data structure. The hierarchical effectiveness indicates how effective the use of the cell will be in executing a task with the data structure. A technique is also provided for determining the hierarchical effectiveness of all of the cells in a data structure, to determine which cells should be employed to execute a task with the data structure.

24 Claims, 11 Drawing Sheets

HIERARCHICAL EVALUATION OF CELLS

FIELD OF THE INVENTION

The present invention relates to the evaluation of cells in a hierarchical data structure. Various embodiments of the invention have particular application to the determination of the effectiveness of cells used to compare a data structure for a circuit layout with a data structure for a circuit schematic.

BACKGROUND OF THE INVENTION

As computers become more and more sophisticated, the data structures that may be employed by those computers have become larger and larger. For example, the design of a new integrated circuit, such as a microprocessor, may include the organization of millions and millions of transistors or other electrical devices into logic circuits, memory circuits, programmable field arrays, and other circuit devices. In order to allow a computer to more easily process these large data structures (and to allow human users to better understand the data structures), large data structures are often broken up into a hierarchical organization of cells. Thus, with the above example, all of the transistors making up a single memory circuit may be categorized into a single cell. Rather than having to enumerate each transistor individually, the group of transistors making up the memory device can thus collectively be referred to and operated on as a single unit. For example, when creating a data structure containing a design for a new integrated circuit, a designer can simply add a single reference for the data corresponding to the cell representing the desired memory device in one operation, rather than having to individually add the data for each transistor making up the memory device.

Typically, a data structure divided into cells will have the cells arranged in a hierarchical manner. The lowest level of cells may include only the basic elements of the data structure. A medium level of cells may then include one or more of the low-level cells, and a higher level of cells may then include one or more of the medium-level cells, and so on. Further, with some data structures, a cell may include one or more lower-level cells in addition to basic elements of the data structure. Thus, for the above example, a cell of data representing a register may include several instances of a cell of data representing a memory circuit, several instances of different cells of data representing various logic devices, and elementary data representing special-purpose connection circuitry. In turn, a cell of data representing a memory array may include several instances of the cell of data representing the register, together with elementary data representing special-purpose connection circuitry.

The division of a data structure into cells may allow tasks to be executed with the data structure more efficiently and with fewer resources. For example, data structures defining a schematic of an integrated circuit must be converted into a corresponding data structure defining the layout of the materials necessary to form the integrated circuit. In the process of translating the data structure describing the schematic (or "source" information) into a data structure describing the layout of materials, however, errors can be introduced. Accordingly, before a large amount of money is spent to make a production run or an integrated circuit based upon the translated layout data structure, the layout data structure is carefully compared with the original schematic data structure. Without dividing both of the data structures into a cellular hierarchy, an element-by-element comparison of both data structures must be made. For a very large integrated circuit, with millions and millions of transistors, such a comparison would be too long to be practical. By dividing both of the data structures into cells, however, a smaller number of data units can be compared to confirm the accuracy of the layout data structure. Thus, the comparison can be made more quickly and using fewer processing resources.

While the use of cells in data structures may allow tasks to be executed with data structures more efficiently, the use of cells themselves may introduce errors into the execution of a task. Thus, with the above example, if a cell in a schematic data structure is inadvertently compared with the incorrect cell in the layout data structure (that is, a cell that is not intended to correspond to the cell in the schematic data structure), then the comparison task will falsely indicate an error that would be avoided by an element-by-element comparison of the schematic data structure with the layout data structure. As will be appreciated by those of ordinary skill in the art, the use of some cells will be very effective in reducing a comparison the amount of processing overhead or memory use, while the use of other cells may have little impact on processing overhead or memory use. Ordinarily, however, it is difficult to determine which cells will be useful to employ in executing a task, such as a comparison operation, and which cells will not be worth employing.

BRIEF SUMMARY OF THE INVENTION

Advantageously, various embodiments of the invention provide a hierarchical effectiveness indicating how effective the use of a cell will be in executing a task with the data structure. According to various embodiments of the invention, the hierarchical effectiveness of a cell is obtained by first determining the number of operations that would be required to execute the task with the data structure by performing operations on each individual element within the data structure. Next, the number of operations are determined that would be required to execute the task by performing operations on each individual component of the cell, and then performing the necessary operations on each instance of that cell occurring within the data structure. The contrast in the number of operations may conveniently be quantified as, for example, a percentage value, indicating the improvement in efficiency that can be obtained by executing the task using the cell.

Still other embodiments of the invention may obtain the hierarchical effectiveness of all of the cells in a data structure to determine which cells should be employed to execute a task with the data structure. With these embodiments, the hierarchical effectiveness of each selected cell in a data structure is determined, and contrasted with the efficiency that would be obtained in using all of the cells in the data structure to execute the task. Thus, the savings value obtained by contrasting the hierarchical effectiveness of using the selected cells to the effectiveness of all using all of the cells is the amount of savings that can be obtained by using the remaining, non-selected cells. If the savings value is above a threshold amount, then the cell with the highest cumulative hierarchical efficiency is added to the list of selected cells to be employed in executing the task This process then is repeated, taking into account each cell that has been selected for executing the task. When the selected cells do not provide a savings value above the threshold, then the selected cells are employed to perform the task, while all other remaining cells (that is, the non-selected cells) are not employed to execute the task.

DETAILED DESCRIPTION OF THE INVENTION

Overview

In order to provide a better understanding of the invention, various embodiments of the invention will be described with respect to the comparison of a data structure describing the original circuit schematic of an integrated circuit to a data structure describing the layout of materials to implement the integrated circuit. Accordingly, a brief description of the process of comparing a schematic data structure with a layout data structure will be described, together with an example of one operating environment in which various embodiments of the invention may be implemented.

The determination of a cell's hierarchical effectiveness according to various embodiments of the invention will then be described, and the application of the hierarchical effectiveness to determine which cells should be employed in executing a task, such as comparing a schematic data structure with a layout data structure, will be described as well.

Schematic and Layout Data Structures

Figure 1:
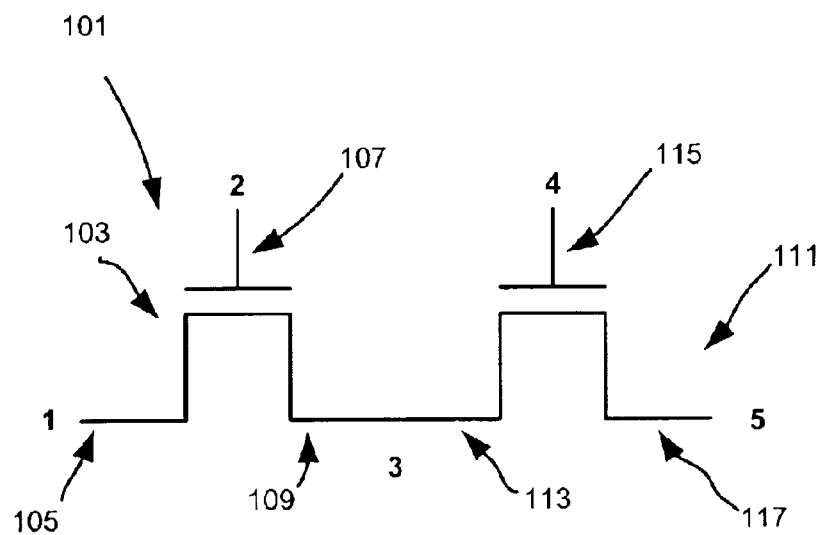
FIG. 1 shows a schematic diagram of a circuit.

Turning now to FIG. 1, this figure illustrates a schematic diagram representing a simple electronic circuit 101. As seen in this figure, the circuit 101 includes a field effect transistor 103, having a drain 105 (labeled as connection point "1"), a gate 107 (labeled as connection point "2"), and a source 109 (labeled as connection point "3").

The circuit 101 also includes a second field effect transistor 111 (connected at connection point "3") to the field effect transistor 103. The field effect transistor 111 includes a drain 113 (also labeled as connection point "3"), a gate 115 (labeled as connection point "4"), and a source 117 labeled as connection point "5").

While schematic diagrams of the type shown in FIG. 1 are useful in understanding the operation of a circuit, they cannot be directly employed to actually create an integrated circuit. Instead, circuit layouts are made based upon the circuit schematic. The layout defines polygons corresponding to the arrangement of materials forming the actual structure of the circuit. The layout may then be used to form, for example, one or more lithographic images for manufacturing the structure of the circuit.

Figure 2:
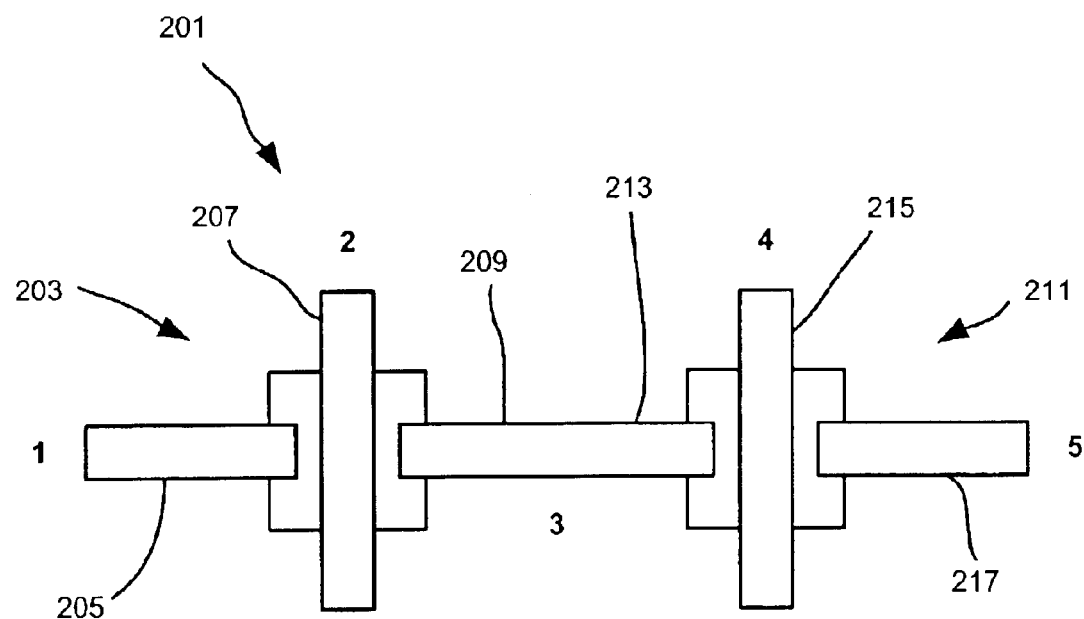
FIG. 2 shows a layout diagram corresponding to the circuit represented in FIG. 1.

For example, FIG. 2 illustrates an exemplary layout diagram 201 for physically implementing the electronic circuit 101 shown FIG. 1. Thus, the layout diagram 201 includes a field effect transistor 203 corresponding to the field effect transistor 103, and a field effect transistor 211 corresponding to the field effect transistor 111. The transistor 203 includes a polygon 205 illustrating the layout of materials that will be used to form the drain 105, a polygon 207 corresponding to the layout of materials used to form the gate 107, and a polygon 209 corresponding to the layout of materials used to form the source 109. Similarly, the transistor 211 includes a polygon 213 illustrating the layout of materials that will be used to form the drain 113, a polygon 215 corresponding to the layout of materials used to form the gate 115, and a polygon 217 corresponding to the layout of materials used to form the source 117.

As will be appreciated by those of ordinary skill in the art, while schematic diagrams of the type illustrated in FIG. 1 and layout diagrams of the type illustrated in FIG. 2 may be useful for understanding simple electronic devices, they are too unwieldly to be effectively used to describe large integrated circuits. Instead, various data structures are used to describe both the information shown in schematic diagrams and layout diagrams. An example of one type of data structure, sometimes referred to as a "netlist," is shown below:

| M1 | 1 | 2 | 3 | P |
| M2 | 3 | 4 | 5 | N |

The first line of the netlist identifies the field effect transistor 103 as device M1, and indicates that this transistor is a P-type transistor. It also indicates that the drain 105 of the transistor 103 is connected to connection point "1", the gate 107 is connected to connection point "2", and that the source 109 is connected to connection point "3".

The second line of the netlist refers to second field effect transistor 111 as M2, and indicates that this transistor is an N-type transistor. The second line of the netlist also indicates that the drain 113 of the field effect transistor 111 is also connected to connection point "3" (and thus to the source 109 of the field effect transistor 103), that the gate 115 is connected to connection point "4", and that the source 117 is connected to connection point "5". Accordingly, the netlist identifies the relevant characteristics of the circuit 101 defined in the schematic diagram shown in FIG. 1.

Similarly, various types of data structures can be used to describe the information illustrated in a circuit layout diagram. For example, the GDSII data format is employed to describe the polygon information defined in a circuit layout. This type of data format may be automatically employed by, for example, a photolithograph device to create material structures corresponding to polygons defined in the layout. As will also be appreciated by those of ordinary skill in the art, the information shown in a layout may also be converted into a netlist like that noted above. The netlist of a layout may, for example, be translated from the GDSII format.

Comparison of the Layout with the Schematic

Thus, a schematic may be employed to design the functions of a circuit, and a layout then formed from the schematic to produce the circuit. While the layout is typically formed from the original schematic, however, the layout may contain significant differences from the schematic. For example, when producing a layout, various changes may be made to the layout in order to optimize the use of surface area on an integrated circuit. A final layout for a circuit may therefore include errors that will cause the circuit to operate differently from the operation planned in the original schematic. Accordingly, before a layout is used to actually produce an integrated circuit, the final version of the layout is checked against the original schematic upon which it is based, to ensure that the layout is accurate. For example, a final layout in the GDSII format may be translated into a netlist format, as described above, and then compared to a netlist describing the original schematic.

In view of the size of modern integrated circuits, however, it is very difficult to compare each element of a schematic netlist with each element of the corresponding layout netlist. For example, an integrated circuit forming a programmable microprocessor may include hundreds of millions of transistors. Comparing netlist data for each transistor would thus require in impractical amount of time and use of resources to complete. Instead, both the schematic netlist and the layout netlist are organized into a hierarchical structure containing different levels of reoccurring cells. That is, devices that repeatedly occur in a specific arrangement can be collected into a single unit, referred to as a cell.

For example, if a group of devices are regularly organized to form memory circuits, then these can be collected into a cell. The cell can then be used as a single data unit for the comparison between the schematic netlist and the layout netlist, rather than comparing every device in the memory circuit. More particularly, when executing the task of comparing the schematic netlist with the layout netlist, the components of a cell in the schematic netlist can be compared with the components of a corresponding cell in the layout netlist. If the components are equivalent, then the cells can thereafter be treated as equivalents. Thus, each time the cell reoccurs in the layout netlist, it will not be compared again to the schematic netlist.

Figure 3:
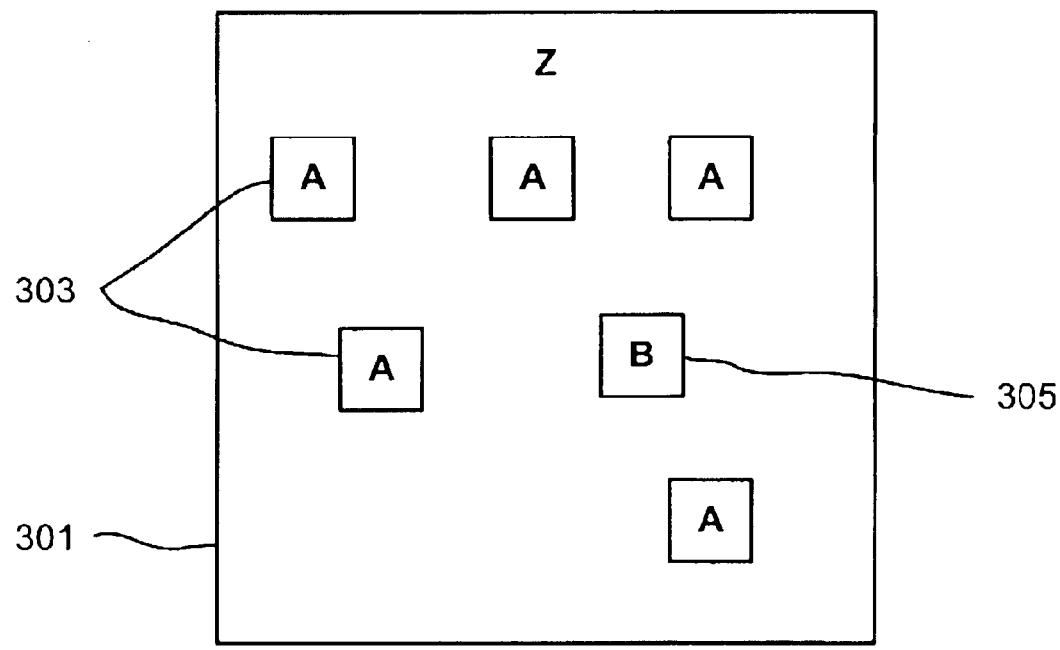
FIG. 3 illustrates one embodiment of a programmable computer that may be used to implement various embodiments of the invention.

A cell may itself contain other cells, forming a hierarchical data structure. For example, FIG. 3 illustrates a cell 301 (labeled as cell "Z"). The cell 301 in turn includes a plurality of instances of a cell 303 (labeled as cell "A") and single instance of a cell 305 (labeled as cell "B"). An exemplary netlist corresponding to the cell "A" is shown below:

| .subckt | A | 1 | 2 | |
|---|---|---|---|---|
| M1 | 1 | 3 | 4 | P |
| M2 | 4 | 5 | 2 | N |
| .end | | | | |

Thus, the netlist defines the cell "A" as being connected to connection points 1 and 2, and having a P-type device with connections at points 1, 3, and 4 and an N-type device having connections at points 4, 5, and 2.

Similarly, an exemplary netlist corresponding to the cell "Z" incorporating the cell "A" is shown below:

| .subckt | Z | 10 | 20 | 30 | 40 |
|---|---|---|---|---|---|
| X1 | 10 | 20 | A | | |
| X2 | 20 | 30 | A | | |
| X3 | 30 | 40 | B | | |
| | | . | | | |
| | | . | | | |
| | | . | | | |
| | | . | | | |
| .end | | | | | |

Thus, this netlist defines the cell "Z" as having connections at connection points 10, 20, 30 and 40. It also defines the first component of the cell "Z" as an instance of cell "A" with connections at points 10 and 20, defines the second component of the cell "Z" as an instance of cell "A" with connections at points 20 and 30, and defines the third component of the cell "Z" as an instance of cell "B" with connections at points 30 and 40.

In order to clarify the structure of cells, the terms "element" or "elementary device" will be used hereafter to refer to a portion of a data structure that cannot be subdivided into smaller portions according to the hierarchical arrangement of the data structure. The term "cell" will then be used to refer any portion of a data structure that can be further subdivided into smaller portions according to the hierarchical arrangement of the data structure. The term "component" will then be generically used to refer to both "cells" and "elements" or "elementary devices." Thus, the components of cell may be one or more other cells, one or more elementary devices, or a combination of both.

While the use of cells can substantially reduce the number of comparison operations required to compare a layout netlist (or other data structure) with a schematic netlist (or other data structure), the cells to be compared must first be determined. That is, equivalent cell pairs (referred to as an "h-cell" or "h-cell" pair) in the schematic netlist and the layout netlist must first be identified before they can be compared for accuracy in executing the comparison task.

H-cell pairs can be selected in a variety of ways. For example, because the layout netlist may be derived from the original schematic, netlist equivalent cells in the schematic netlist and the layout netlist may share the same or similar names. Alternately, the h-cell pairs may be designated by a user. This technique for designating h-cell pairs may be useful, where, for example, a user has employed standard cell methodology to create the schematic data structure, the layout data structure, or both. Also, heuristics may be employed to match h-cell pairs between a schematic data structure and a layout data structure. For example, if both the schematic data structure and the layout data structure include a cell that has exactly 523 instances, then those cells are probably equivalent, and thus may be designated as an h-cell pair.

While the use of cells can substantially decrease the processing overhead in comparing a schematic netlist with a layout netlist, the selection of an incorrect h-cell pair can create significant errors in the comparison task. For example, if a cell in the schematic netlist is erroneously indicated as part of an h-cell pair with a non-equivalent cell in the layout netlist, then the comparison task will provide an error indicating that the cells are not equivalent. A user, however, would be unable to determine whether the error was created because the layout netlist actually contained an error, or because the two cells were, in fact, not equivalent and should not have been compared. In response, the components of each cell will then have to be compared on a component-by-component basis in the context of a higher level parent cell. Because the cells are not equivalent, the parent cells will probably likewise not be equivalent, and thus other yet-higher-level parent cells, if any, will need to be compared on a component-by-component basis. This process of expanding cells may continue until the comparison task becomes impractically long.

Accordingly, when executing the task of comparing a schematic netlist with a layout netlist, it is desirable to only employ those h-cell pairs that will provide a substantial reduction in the comparison process. H-cell pairs that do not provide a substantial reduction in the comparison process can be compared on a component-by-component basis, to avoid creating false errors if the h-cell pairs are, in fact, not equivalent. Advantageously, various embodiments of the invention can determine a hierarchical effectiveness value for a cell in a data structure. Cells with a relatively high hierarchical effectiveness value can then be used in a desired task, such as the comparison of a layout netlist with a schematic netlist. Those cells which do not have a sufficiently high hierarchical effectiveness value can be ignored when executing the desired task.

Operating Environment

As will be appreciated by those of ordinary skill in the art, the determination and use of a hierarchical effectiveness of a cell may be accomplished using electronic circuitry, such as solid state circuitry. Various embodiments of the invention, however, may be implemented using computer-executable instructions, such as software program modules, executed by a programmable computing device. Because these embodiments of the invention may be implemented using software, the components and operation of a typical programmable computer system on which such embodiments of the invention may be employed will first be described. More particularly, the components and operation of a programmable computer will be described with reference to FIG. 4. This operating environment is only one example of a suitable operating environment, however, and is not intended to suggest any limitation as to the scope of use or functionality of the invention.

Figure 4:
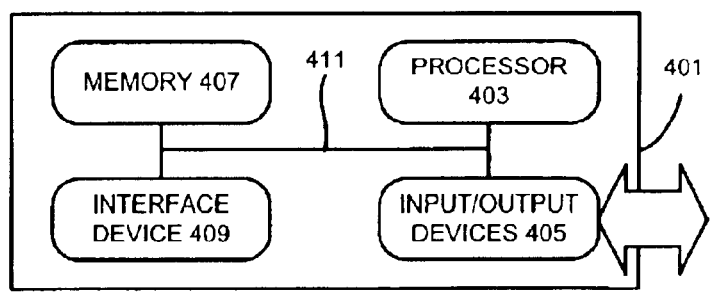
FIG. 4 shows an example of how a data structure may have a hierarchical arrangement.

In FIG. 4, the computer 401 has a programmable processor 403, such as a microprocessor implemented on an integrated circuit. The computer 401 also may have a plurality of input and output devices 405 and a memory 407. The input and output devices 405 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 407 may similarly be implemented using any combination of computer readable media that can be accessed, either directly or indirectly, by the processor 403. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD) or other optical storage devices. The computer readable media may also include magnetic cassettes, magnetic tapes, magnetic disks or other magnetic storage devices, punched media, holographic storage devices, or any other medium that can be used to store desired information.

According to various embodiments of the invention, the computer 401 may also include one or more interface devices 409 for exchanging data with other computers. The interface devices 409 may include, for example, a modem, wired network card, wireless network card, or any other suitable device for communicating with one or more remote computers. Each of the processor 403, the input and output devices 405, the memory 407 and the user interface device 409 may be interconnected using a data bus 411. As will be appreciated by those of ordinary skill in the art, the data bus 411 may by implemented using any type of suitable bus structure.

Determining the Hierarchical Effectiveness of a Cell

Figure 5A:
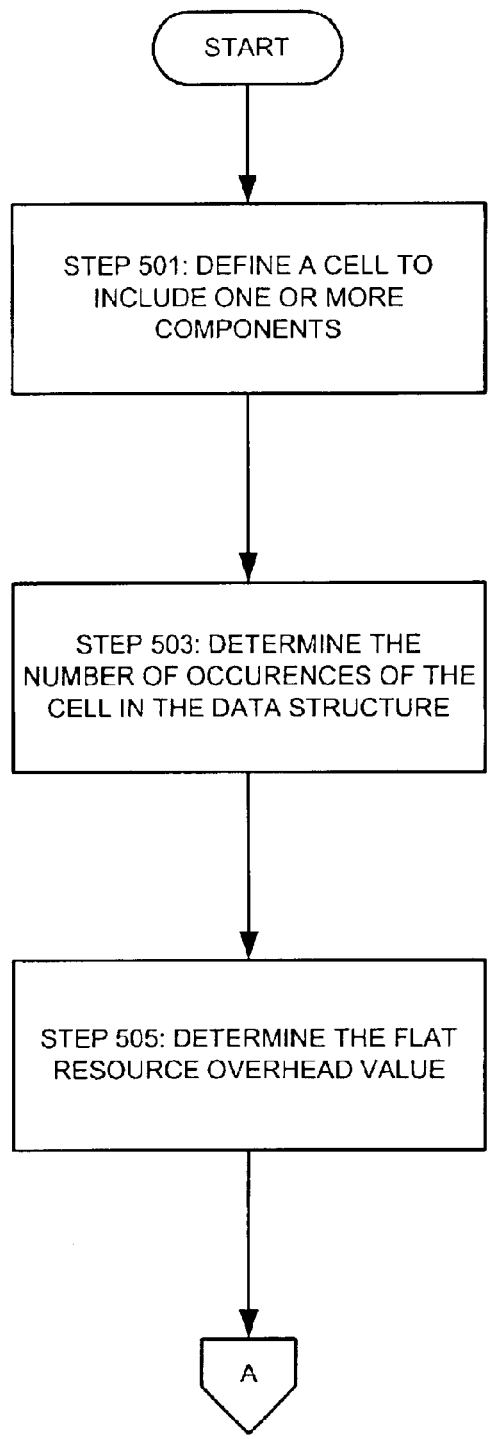
FIGS. 5A and 5B show a flowchart describing a method for determining a hierarchical effectiveness of a cell in a data structure according to various embodiments of the invention.
Figure 5B:
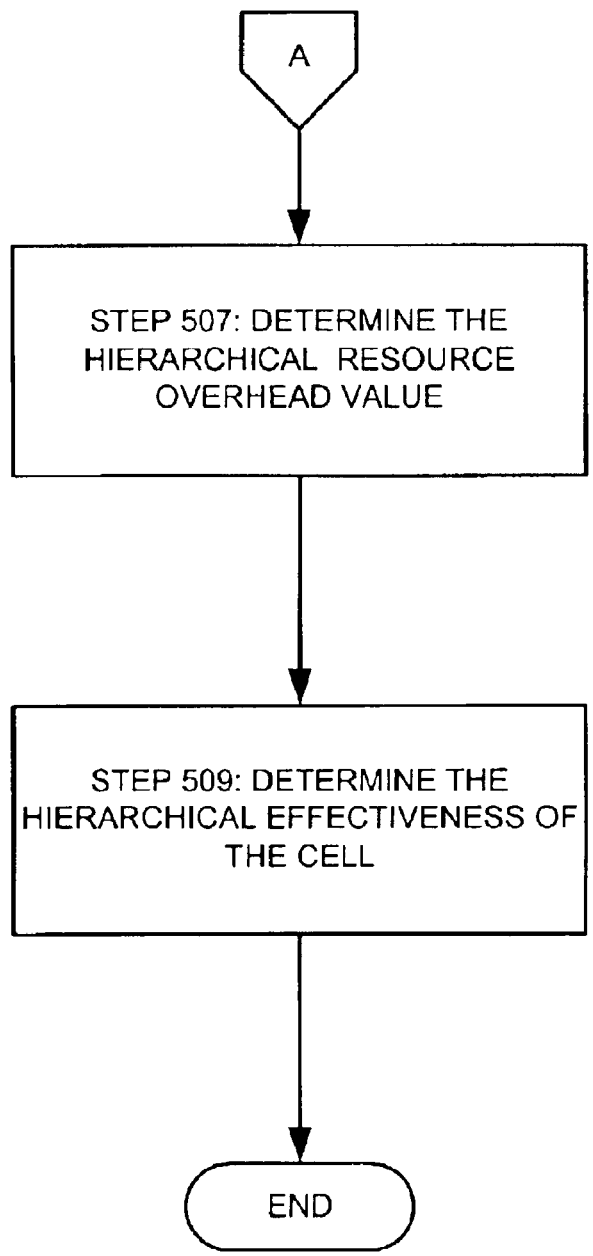
Figure 6:
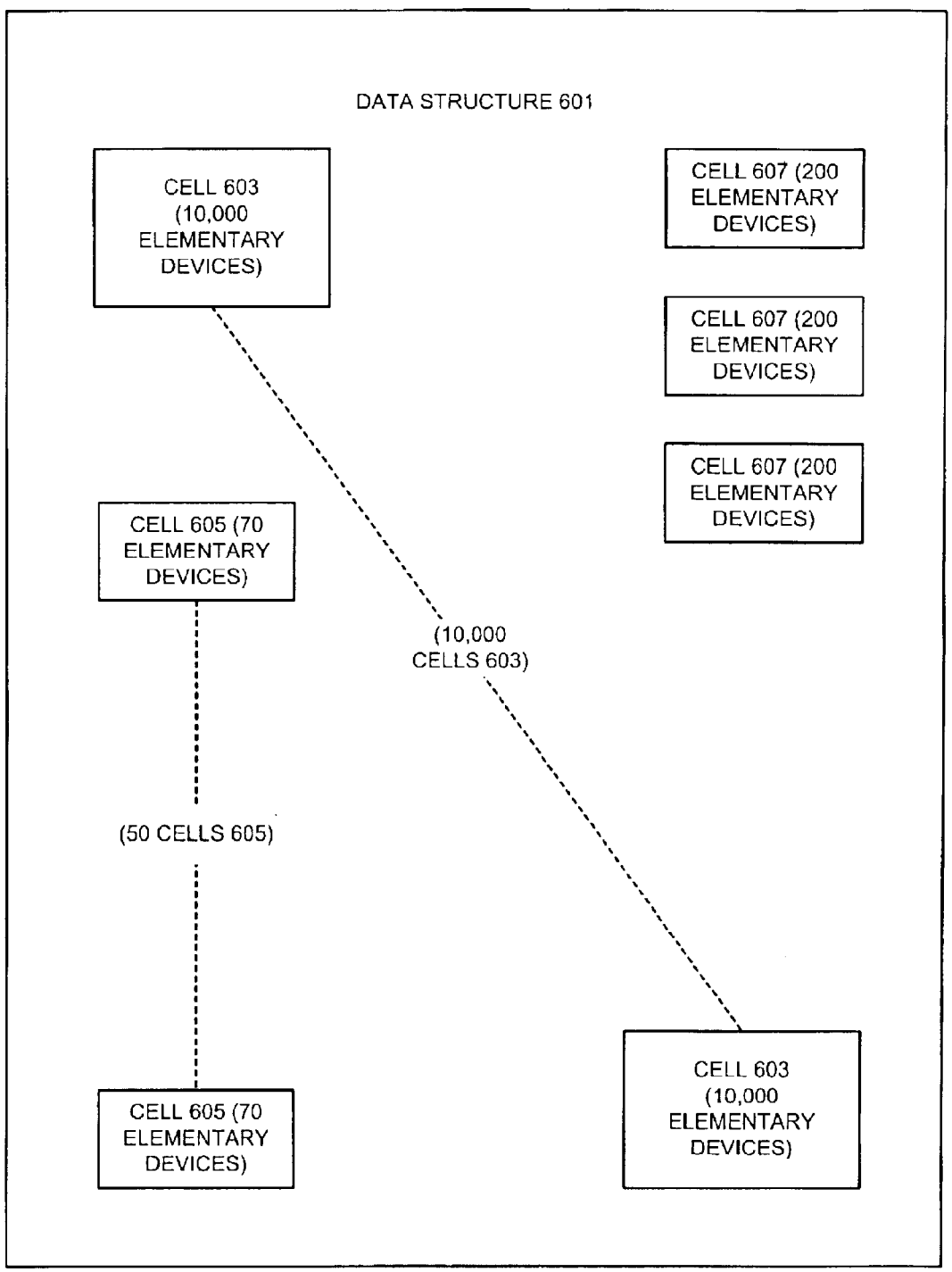
FIG. 6 diagrammatically depicts a data structure having a hierarchical arrangement.

Turning now to FIGS. 5A and 5B, these figures illustrate a flow chart showing a method for calculating the hierarchical effectiveness of a cell in a circuit netlist according to various embodiments of the invention. The use of this method will be described with reference to FIG. 6. FIG. 6 illustrates a data structure 601, which in turn contains several instances of a cell 603, a cell 605, and a cell 607. More particularly, the data structure 601 contains 10,000 instances of the cell 603. Each instance of the cell 603 itself contains 10,000 elementary devices. The data structure 601 then contains 50 instances of the cell 605, and each instance of the cell 605 itself contains 70 elementary devices. The data structure 601 further includes three instances of the cell 607, which itself contains 200 elementary devices. Thus, the data structure 601 includes 100,000,000 elementary devices in the cells 603, 3500 elementary devices contained within the cells 605, and 600 elementary devices contained within the cells 607, for a total of 100,004,100 elementary devices.

Returning now to FIG. 5, the determination of the hierarchical effectiveness of each of cells 603–607 will now be explained. First, in step 501, a cell is defined as containing one or more components. In the illustrated embodiment, each of cells 603–607 contains only elementary devices. Thus, the hierarchical effectiveness determined in this example will be the absolute hierarchical effectiveness. That is, the absolute hierarchical effectiveness is the hierarchical effectiveness of a cell assuming the existence of no other cells in the data structure. As will be explained in more detail below, the cumulative hierarchical effectiveness of the cell may also be determined. The cumulative hierarchical effectiveness of a cell is the hierarchical effectiveness of the cell taking into account the effect of one or more other cells in executing the task with the data structure. As previously noted, the definition of the cell 603 includes 10,000 elementary devices. The definition of the cell 605 then includes 70 elementary devices, while the definition of the cell 607 includes 200 elementary devices.

Next, in step 503, the number of occurrences of the cell in the data structure is determined. As also noted above, the cell 603 occurs 10,000 times in the data structure 601. The cell 605 occurs 50 times in the data structure 601 while the cell 607 occurs only three times in the data structure 601. In step 505, the flat resource value of the data structure (in this example, data structure 601) is then determined. Because the illustrated embodiment relates to the comparison of a layout netlist with a schematic netlist, the flat resource value of the data structure in this example can be determined based upon the number of comparison operations that would need to be made to compare the data structure 601 with a corresponding data structure without the use of cells. Thus, the total number of comparison operations that would be needed to compare the data structure 601 on a component-by-component basis would be 100,004,100, the number of elementary devices included in the data structure 601.

In step 507, the hierarchical resource value for a cell is then determined. This value may be obtained by, for example, determining the number of operations that would be needed to execute the desired task by performing an operation on each component of the cell, and then performing an operation on each instance of the cell in the data structure 601. Thus, with the illustrated embodiment, the hierarchical resource value for a cell will be determined by adding the number of operations that would be needed to compare each component of the cell with the number of operations that would be needed to compare each instance of the cell in the data structure 601. Further, the hierarchical resource value determined for a cell in the illustrated embodiment is based upon the total number of operations needed to perform the task on the entire data structure, and thus takes into consideration components both within and outside of the cell.

More particularly, in step 507, the hierarchical resource value for a particular cell is obtained by, for example, determining the number of operations that would be needed to execute the desired task by performing an operation on each component of the cell, and then performing an operation on each component that is not in the cell and then performing an operation on each instance of that particular cell within the aggregate data structure. Thus, with the illustrated embodiment, the hierarchical resource value for a cell in the data structure 601 will be determined by adding the number of operations that would be needed to compare each component of that particular cell with the number of operations that would be needed to compare each element of data structure 601 that is not in that particular cell and the number of operations that would be needed to compare each instance of that particular cell within the data structure.

For example, executing a comparison task on the data structure 601 using the cell 603 would require 24,100 operations. More specifically, 3500 component comparison operations would be needed to compare each of the elementary devices in the cells 605, and 600 component comparison operations would be needed to compare each of elementary devices in the cells 607. In order to compare only a single cell 603, 10,000 component comparison operations would be needed. Each cell 603 in the data structure 601 could then be compared directly with another cell, requiring only an additional 10,000 cell comparison operations, for a total of 24,100 operations.

On the other hand, executing a comparison task on the data structure 601 using only the cell 605 would require 100,000,720 comparison operations. More specifically, 100,000,000 component comparison operations would be needed to compare each of the elementary devices in the cells 603, while 600 component comparison operations would be needed to compare each of the elementary devices in the cells 607. Comparing only a single cell 605 would require 70 component comparison operations. An additional 50 cell comparison operations would then be required to compare each occurrence of the cell 605 in the data structure 601, providing a total number of 100,000,720 comparison operations. Similarly, executing a comparison task on the data structure 601 using only the cell 607 would require 100,003,703 comparison operations. Comparing the elementary devices in the cells 603 would require 100,000,000 component comparison operations, while comparing the elementary devices and the cells 605 would require 3500 component comparison operations. Comparing each component in a single cell 607 would require 200 component comparison operations. Each instance of the cell 607 could then be compared using 3 cell comparison operations, for a total of 100,003,703 comparison operations.

Finally, in step 509, the hierarchical resource value is contrasted with the flat resource value to determine the hierarchical effectiveness of the cell. For example, the hierarchical effectiveness of the cell may be the percentage reduction in operations obtained by using the cell instead of executing the task without using any cells. More particularly, the hierarchical effectiveness may be calculated according to the following formula:

$$\text{hierarchical effectiveness value} = 100 - \left(100 \times \frac{\text{hierarchical resource value}}{\text{flat resource value}}\right)$$

Thus, for the above example, the hierarchical effectiveness of the cell 603 is 99.976%. The hierarchical effectiveness of the cell 605 is then 0.00338%, while the hierarchical effectiveness of the cells 607 is only 0.00397%. Accordingly, based upon the hierarchical effectiveness of cell, employing only cell 603 to execute a task would provide a substantial reduction in time and processing resources.

It should be appreciated, however, that other techniques may be used to contrast the hierarchical resource value with the flat resource value. For example, a ratio between the hierarchical resource value and the flat resource value (or a ratio between the flat resource value and the hierarchical resource value) can be employed as the hierarchical effectiveness value for a cell. Alternately, a difference between the flat resource value and the hierarchical resource value may be employed as the hierarchical effectiveness value for a cell. Still other techniques for quantifying the relationship between the hierarchical resource value and the flat resource value will also be apparent from the foregoing description to those of ordinary skill in the art.

It should also be noted, that, while the embodiments of the invention described above determine the hierarchical effectiveness of a cell based upon the total number of operations needed to execute a task upon an entire data structure, still other embodiments of the invention may determine the hierarchical effectiveness of a cell based upon only upon the reduction in the number of operations obtained by using a cell. Thus, these embodiments do not take into account the number of operations to be performed on components outside of the cell that would be necessary to execute a task on the data structure.

In addition, various embodiments of the invention may determine the hierarchical effectiveness of a cell using other criteria. For example, some embodiments of the invention may determine the hierarchical effectiveness of a cell based upon the amount of memory required to execute a task using the cell when contrasted with the amount of memory required to execute the task without using the cell. Of course, any other desired criteria for determining the hierarchical effectiveness of a cell may also be employed.

Thus, the various embodiments for determining the hierarchical effectiveness of a cell provide a user with a quantifiable determination of the benefits that may be obtained in using a cell. The hierarchical effectiveness of a cell can be used, for example, to identify its h-cell equivalent. For example, if the hierarchical effectiveness of a cell in a schematic data structure matches the hierarchical effectiveness of a cell in the corresponding layout data structure, then the cells may be compared as an h-cell pair. As will be discussed in detail below, the hierarchical effectiveness of a cell may also be used to determine whether or not to employ an h-cell pair in comparing a layout data structure with a schematic data structure. Advantageously, the hierarchical effectiveness of either cell in an h-cell pair may be employed to determine if the entire h-cell pair will be used to execute a task.

Determination of Cells for use in Execution of a Task

Figure 7:
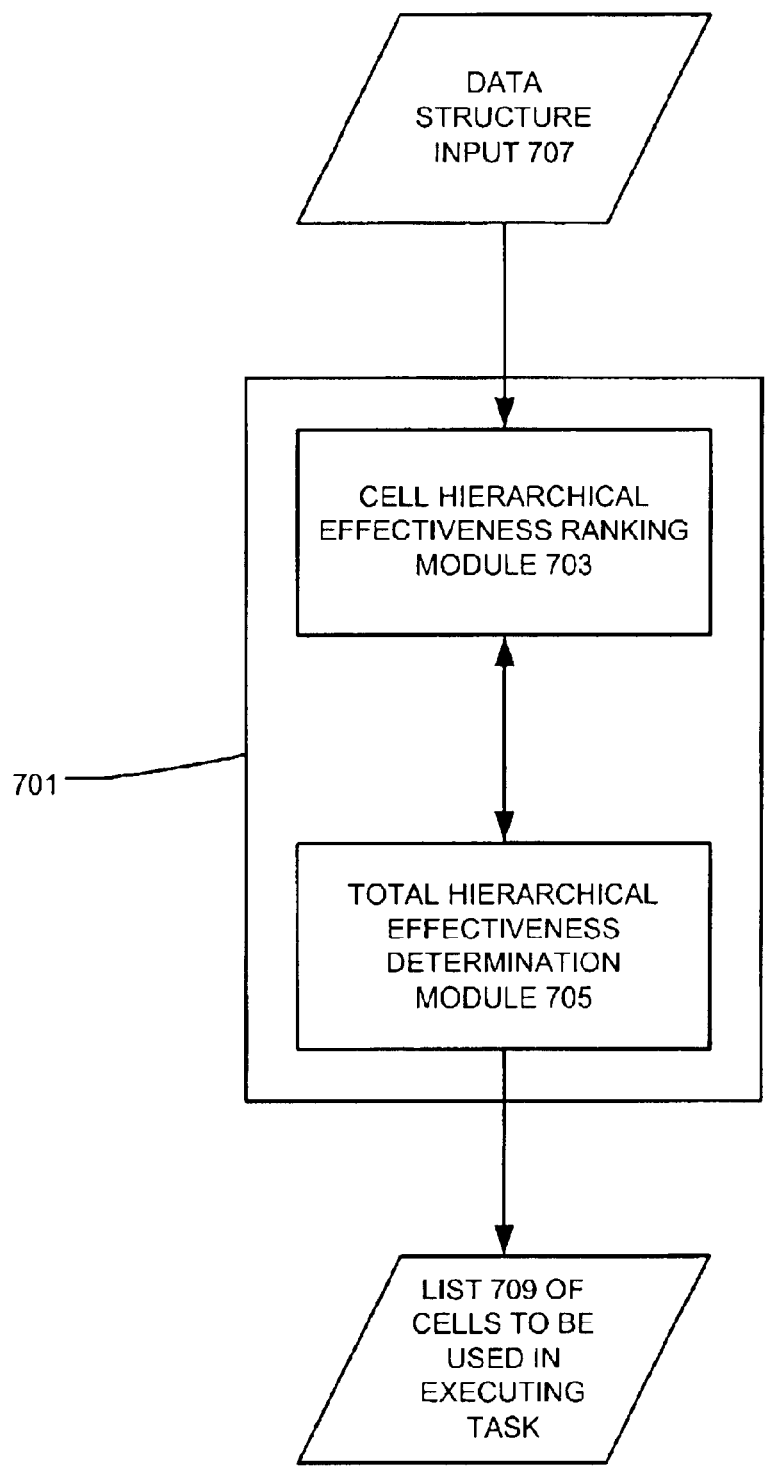
FIG. 7 illustrates a tool for determining the use of h-cell pairs when comparing a layout data structure with a schematic data structure.

Once the hierarchical effectiveness of the cell has been determined, it can then be employed to choose which cells have a sufficiently high hierarchical effectiveness to be employed when executing a task on the data structure. FIG. 7 illustrates a tool 701 for deciding which cells in a hierarchical data structure should be employed when executing a task on the data structure. In particular, the tool 701 includes a cell hierarchical effectiveness ranking module 703 and a total hierarchical effectiveness determination module 705. As will be discussed in detail below, the cell hierarchical effectiveness ranking module 703 receives a data structure input 707 containing the data structure upon which the task is to be executed. The cell hierarchical effectiveness ranking module 703 then determines a hierarchical effectiveness ranking for each cell in the input data structure. As will also be discussed in detail below, the total hierarchical effectiveness determination module 705 determines the total hierarchical effectiveness of using various cells of the input data structure based upon the rankings provided by the cell hierarchical effectiveness ranking module 703. The cell hierarchical effectiveness ranking module 703 and the total hierarchical effectiveness determination module 705 continue to exchange data until the list 709 of selected cells, which will be used in executing the task with the data structure, is obtained.

Figure 8A:
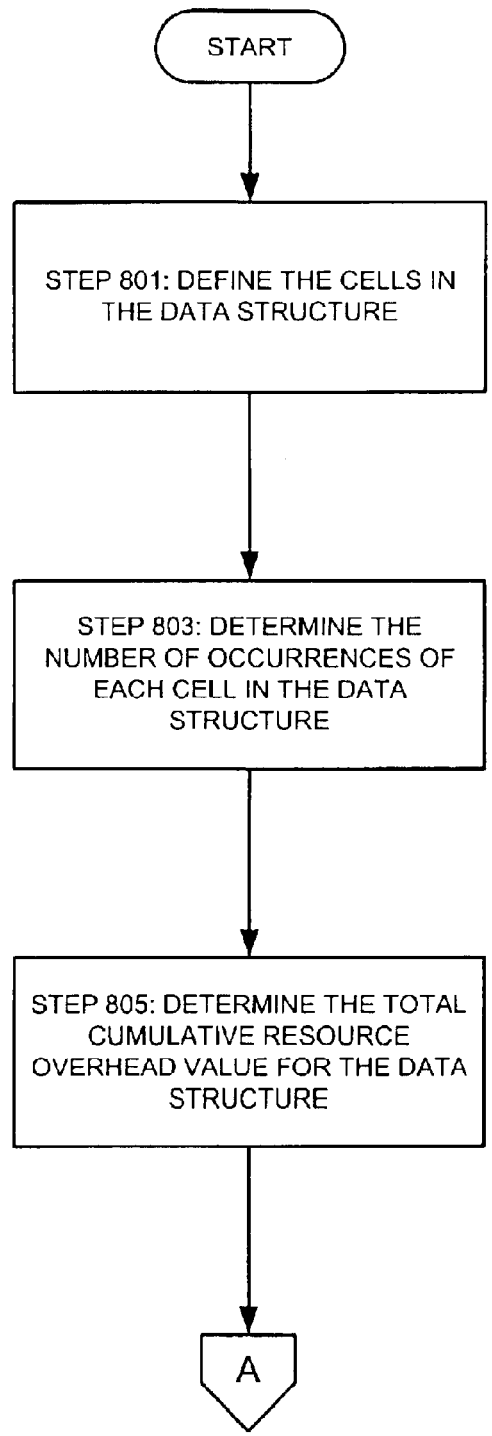
FIGS. 8A–8C illustrate a method for determining the use of h-cell pairs that may be employed to compare a layout data structure with a schematic data structure according to various embodiments of the invention.
Figure 8B:
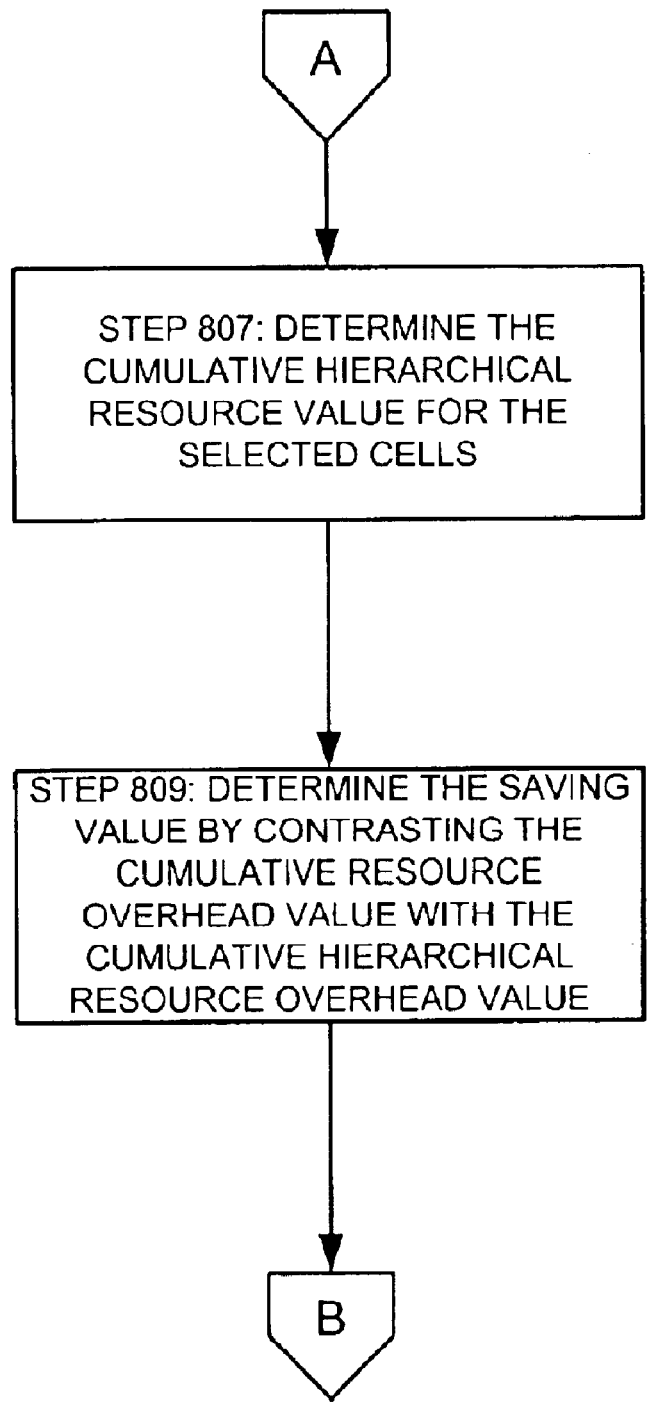
Figure 8C:
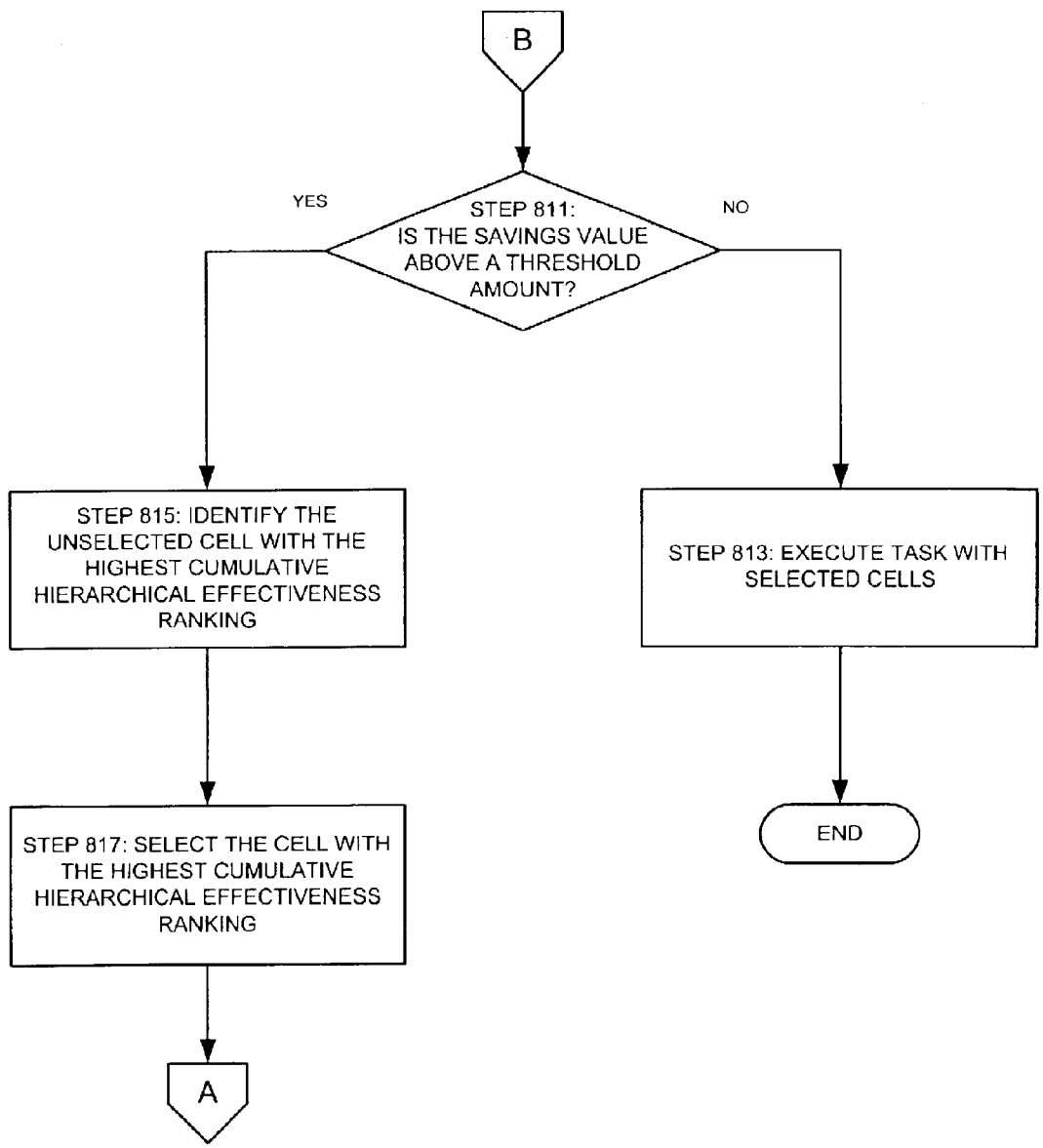
Figure 9:
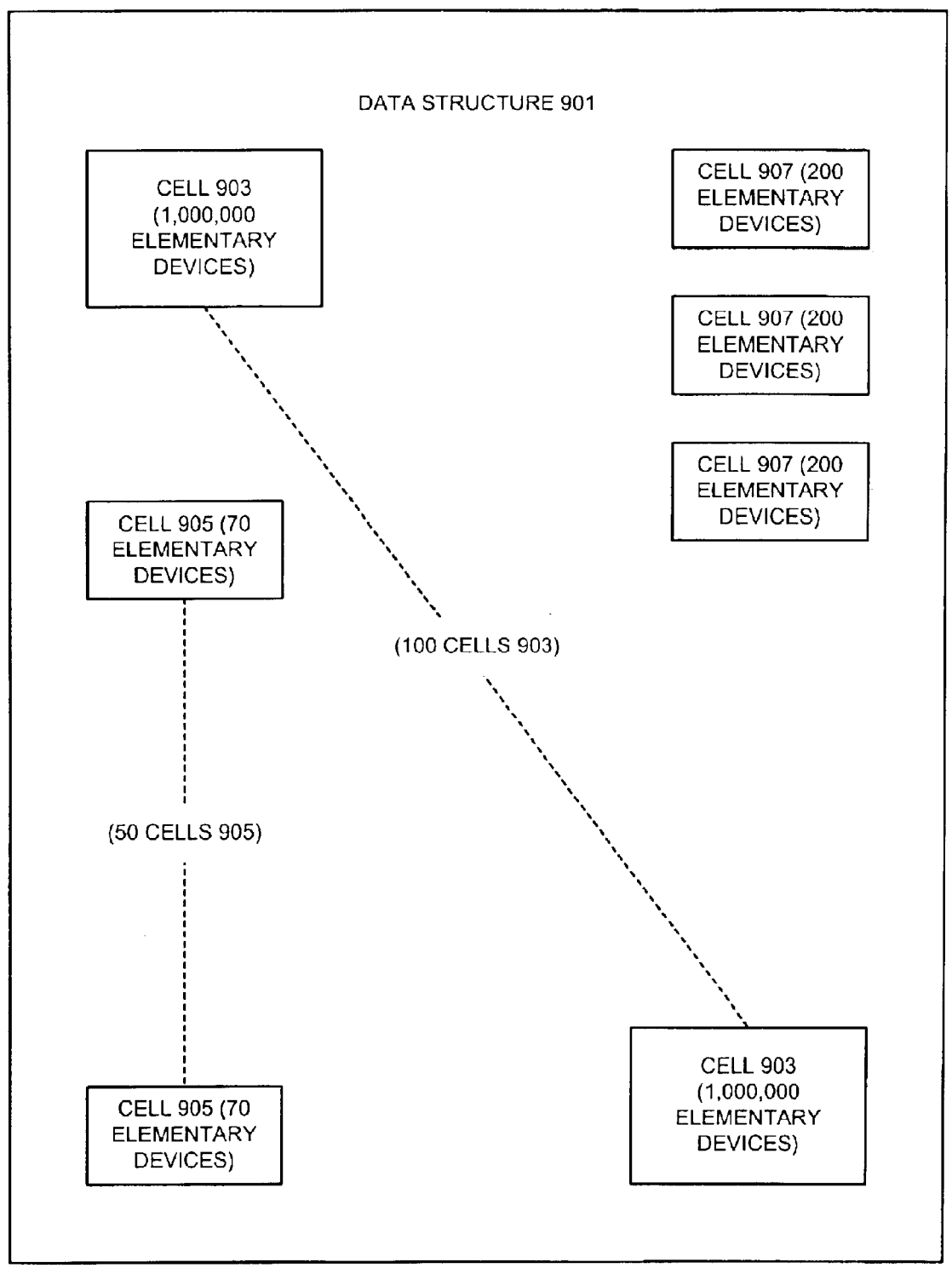
FIGS. 9 and 10 diagrammatically depict data structures having a hierarchical arrangement.

The operation of the tool 701 will be described in more detail with reference to the flow chart shown in FIGS. 8A–8C and the data structures illustrated in FIGS. 9 and 10. As will be discussed in more detail below, FIG. 9 diagrammatically represents a data structure having a plurality of cells 903–907. Further, one of these cells, cell 903, is itself made up of a plurality of lower-level cells 1001, as diagrammatically in illustrated in FIG. 10. Initially, step 801, the cell hierarchical effectiveness ranking module 703 defines the group of cells in the data structure 901. Next, in step 803, the cell hierarchical effectiveness, ranking module determines the number of occurrences of each cell in the data structure 901. Turning now to FIG. 9, the data structure 901 includes cells 903, 905, and 907. In particular, the data structure 901 includes 100 instances of the cell 903, each of which in turn includes 1,000,000 elementary devices, for a total of 100,000,000 elementary devices. The data structure 901 also includes 50 instances of a cell 905, each of which includes 70 elementary devices for a total of 3500 elementary devices, and three instances of the cell 907, each of which includes 200 elementary devices for a total of 600 elementary devices. Thus, the total number of component comparison operations necessary to compare all of the elementary devices in the data structure 901 is 100,004,100.

In step 805, the total hierarchical effectiveness determination module 705 determines the total cumulative resource value for the data structure 901. That is, the total hierarchical effectiveness determination module 705 determines the total cumulative resource value associated with executing the desired task using every cell in the data structure 901. With the example shown in FIGS. 9 and 10, the total cumulative resource value is 2423. More particularly, comparing only a single cell 1001 would require 1000 component comparisons, and then each cell 1001 in a cell 903 could be compared using 1,000 cell comparison operations, for a total of 2,000 operations. Each instance of the cell 903 could then be compared with an additional 100 cell comparison operations, bringing the total to 2,100. Comparing only a single cell 905 would require 70 component comparison operations. An additional 50 cell comparison operations would then be required to compare each occurrence of the cell 905 in the data structure 901, bringing the total to 2,220. Comparing each component in a single cell 907 would require 200 component comparison operations. Each instance of the cell 907 could then be compared using 3 cell comparison operations, for a total of 2423 operations.

Next, in step 807, the cell hierarchical effectiveness ranking module 703 determines the cumulative hierarchical resource value for the selected cells. At this stage of the process, no cells have been selected. Accordingly, the cumulative hierarchical resource value for the selected cells is the same as the number of component comparison operations necessary to compare all of the elementary devices in the data structure 901, which is 100,004,100 as noted above.

Next, in step 809, the total hierarchical effectiveness determination module 705 determines a savings value by contrasting the total cumulative resource value with the hierarchical cumulative resource value for the selected cell. With this embodiment, the total cumulative resource value is determined according to the following formula:

$$\text{savings value} = 100 \times [(\text{cumulative hierarchical resource value} - \text{total cumulative resource value}) / \text{cumulative hierarchical resource value}].$$

Thus, the initial savings value is 100×[(100,004,100−2423)/100,004,100]=99.9975%. Thus, this is the additional savings that can be obtained by using all of the remaining cells in the data structure.

Next, in step 811, the total hierarchical effectiveness determination module 705 compares the determined savings value with a desired threshold value, to determine if the cumulative savings provided by using the remaining unselected cells in the data structure to execute the task is sufficiently high. If the savings value is not above the threshold (that is, if a minimum savings cannot be obtained by using the remaining unselected cells in the data structure), then the process of selecting cells terminates and the task is executed in step 813. In the illustrated embodiment, the threshold value is 30%, so the initial savings value is sufficiently high to pass the threshold. Accordingly, the process of selecting cells continues to step 815, in which the unselected cell with the highest cumulative hierarchical effectiveness ranking is identified.

In order to determine the unselected cell with the highest cumulative hierarchical effectiveness ranking, the cell hierarchical effectiveness ranking module 703 may determine the cumulative hierarchical resource value for each cell in the data structure 901. As no cells have yet been selected, the cumulative hierarchical resource value for each cell will be the same as the absolute hierarchical resource value for each cell. Thus, executing a comparison task on the data structure 901 using the cell 903 would require 1,004,200 operations, giving cell 903 a cumulative hierarchical resource value of 1,004,200. More particularly, 3500 component comparison operations would be needed to compare each of the elementary devices in the cells 905, and 600 component comparison operations would be needed to compare each of the elementary devices in the cells 907. In order to compare only a single cell 903, 1,000,000 component comparison operations would be needed, and then each cell 903 in the data structure 601 could then be compared directly with another cell, requiring only an additional 100 cell comparison operations, for a total of 1,004,200 operations.

Executing a comparison task on the data structure 901 using only the cell 905 would require 100,000,720 comparison operations. More specifically, 100,000,000 component comparison operations would be needed to compare each of the elementary devices in the cells 903, while 600 component comparison operations would be needed to compare each of the elementary devices in the cells 907. Comparing only a single cell 905 would require 70 component comparison operations. An additional 50 cell comparison operations would then be required to compare each occurrence of the cell 905 in the data structure 901, providing a total number of 100,000,720 comparison operations. Executing a comparison task on the data structure 901 using only the cell 907 would then require 100,003,703 comparison operations. Comparing the elementary devices in the cells 903 again would require 100,000,000 component comparison operations, while comparing the elementary devices and the cells 905 would require 3500 component comparison operations. Comparing each component in a single cell 907 would require 200 component comparison operations. Each instance of the cell 907 could then be compared using 3 cell comparison operations, for a total of 100,003,703 comparison operations.

Figure 10:
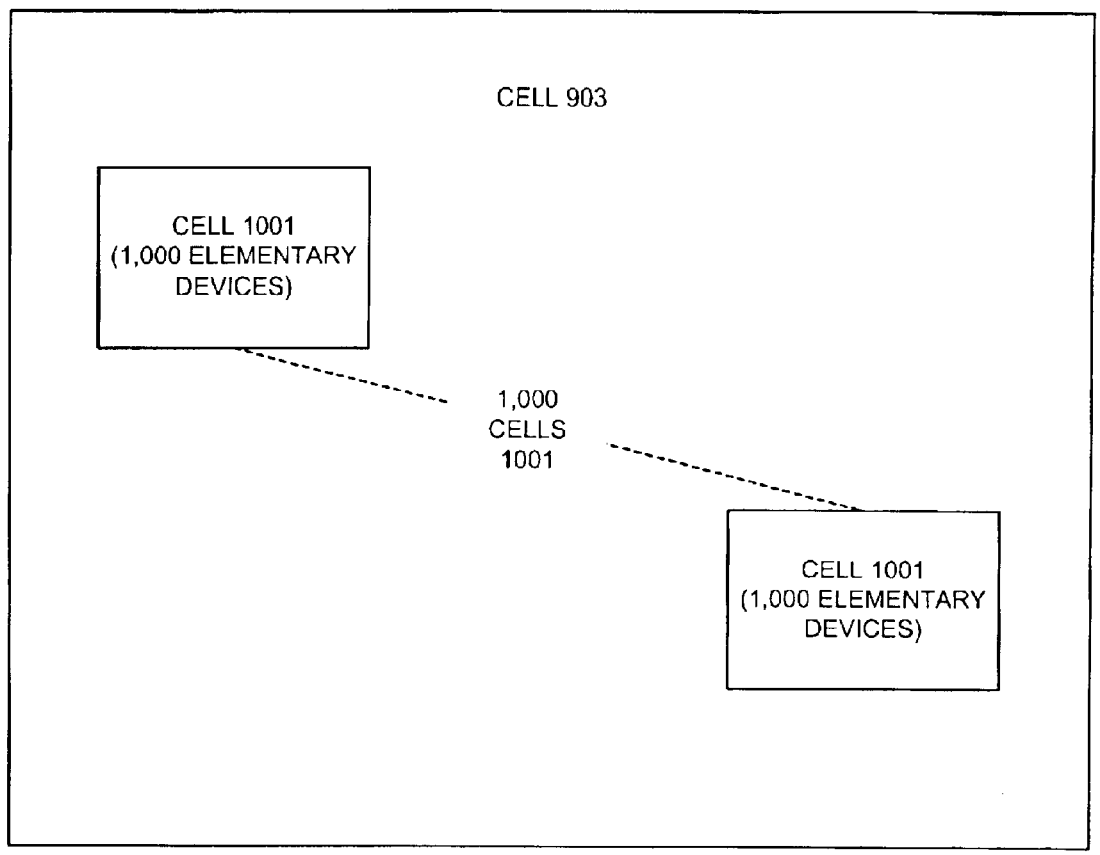

As shown in FIG. 10, the cell 903 can be divided into 1000 instances of cell 1001, each of which contains 1,000 elementary devices. Accordingly, the hierarchical effectiveness ranking of this cell must be considered as well. If the cell 1001 is employed to execute the comparison task on the cell 901, then 105,100 comparison operations would be required. As noted above, 3500 component comparison operations would be needed to compare each of the elementary devices in the cells 905, and 600 component comparison operations would be needed to compare each of the elementary devices in the cells 907. Each cell 903 contains 1,000 cells 1001, and data structure 901 includes 100 of cells 903 for a total of 100,000 of the cells 1001. In order to compare only a single cell 1001, 1,000 component comparison operations would be needed, for a total of 105,100 operations.

Thus, the cell 903 has an absolute hierarchical effectiveness value of 98.99%, while the absolute hierarchical effectiveness value of cell 905 is 0.00338%. Similarly, the absolute hierarchical effectiveness value of the cell 907 is 0.000397%, while the absolute hierarchical effectiveness value of the cell 1001 is 99.89%. Thus, the cell 1001 has the highest cumulative (and absolute) hierarchical effectiveness ranking of all of the cells in data structure 901. Accordingly, in step 817, the cell 1001 is added to the list of selected cells.

It should be noted that, in the above example, the hierarchical effectiveness value described above was used to determine the cell with the highest hierarchical effectiveness ranking. It should be noted, however, that other values can be employed to determine the cell with the highest hierarchical effectiveness ranking. For example, with some embodiments of the invention, the cell with the highest hierarchical effectiveness ranking may be identified using the cumulative hierarchical resource value for each cell. Thus, the cell with the lowest hierarchical resource value would be identified as the cell with the highest hierarchical effectiveness ranking.

Returning now to step 807, the total hierarchical effectiveness determination module determines the cumulative hierarchical resource value for the selected cells (which, in this example, is cell 1001). Accordingly, when repeating step 807, the cumulative total resource value for the data structure 901 will be 105,100. More particularly, 1,000 component comparison operations will be required to compare the elementary devices in a single instance of cell 1001, and then 100,000 cell comparison operations will be required to compare all of the occurrences of cell 1001 in data structure 901. Another 3500 and 600 component comparison operations will then be required to compare the elementary devices found in the cells 905 and 907, respectively, for a total of 105,100.

Next, in repeating step 809, the total hierarchical effectiveness determination module 705 determines a savings value by contrasting the total cumulative resource value with the hierarchical cumulative resource value for the selected cell. With this embodiment, the savings value is again determined according to the following formula:

$$\text{savings value} = 100 \times [(\text{cumulative hierarchical resource value} - \text{total cumulative resource value}) / \text{cumulative hierarchical resource value}]$$

Thus, the cumulative savings value when using cell 1001 is 100×[(105,100−2423)/105,100]=97.69%. Thus, this is the additional savings that can be obtained by using all of the remaining cells in the data structure in addition to using cell 1001.

Next, in step 811, this savings value is determined to again be above the threshold value of 30%. Accordingly, in step 815, the cell hierarchical effectiveness ranking module 703 determines the unselected cell with the highest cumulative hierarchical effectiveness ranking. Thus, the cumulative hierarchical resource value for cell 903 would then be 6,200. More particularly, 1,000 component comparison operations would be needed to compare all of the elementary devices in one instance of the cell 1001, and another 1000 cell comparison operations would be needed to compare all of the cells 1001 in a single instance of the cell 903. Only 100 cell comparison operations would then be needed to compare all of the instances of the cell 903 in the data structure 901, for a total of 2100 operations. As noted above, 3500 and 600 component comparison operations will then be required to compare the elementary devices found in the cells 905 and 907, respectively, for a total of 6200 operations. Using the same analysis, the cumulative hierarchical resource value for the cell 905 would be 101,729, while the cumulative hierarchical resource value for the cell 907 would be 104,703. Accordingly, the cumulative hierarchical effectiveness value for the cell 903 would be 94.1%, while the cumulative hierarchical effectiveness values for the cells 903 and 905 would be 3.2% and 0.377%, respectively. Thus, when step 817, is repeated, the cell 903 is selected.

Returning to step 807, the cumulative hierarchical resource value of the selected cells is 6200. Then, when step 809 is again repeated, the savings value obtained when using cell 903 will be 100×[(6200−2423)/6200]=60.91%. Again, as this value is determined to be higher than the threshold value of 30% in step 811, the cell hierarchical effectiveness ranking module 703 will determine the remaining unselected cell with the highest cumulative hierarchical effectiveness ranking in step 815.

When the process again repeats to determine if either of cells 905 or 907 should be employed to execute the task, the cumulative resource value will be 6200. The cumulative hierarchical resource value for the cell 905 will then be 2820, while the cumulative hierarchical resource value for the cell 907 will be 5803. Thus, the cumulative hierarchical effectiveness value for the cell 905 will be 54.5%, while the cumulative hierarchical effectiveness value for the cell 907 will be 6.4%, giving the cell 905 the highest hierarchical effectiveness ranking. Accordingly, in step 817, the cell 905 is selected. Returning to step 807, the cell hierarchical effectiveness ranking module 703 determines that the cumulative hierarchical resource value for the selected cells is 2820. Thus, when the cumulative hierarchical resource value for cell 905 is then contrasted with the total cumulative resource value for the data structure 901, the savings value is 100×[(2820−2423)/2820]=14.07%.

As this value is determined to be below the threshold value of 30% in step 813, no further cells are selected. Instead, in step 813, the desired task is executed using the selected cells (which, in this example, are cells 1001, 903 and 905).

Accordingly, various embodiments of the invention provide a technique for determining which cells in a hierarchical data structure will be most effective in executing a desired task with the data structure. Thus, embodiments of the invention may be employed to determining which h-cell pairs of a schematic data structure and a layout data structure should be employed to compare the schematic data structure with the layout data structure.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method of evaluation a cell in a data structure, comprising:

defining a cell including one or more components;

determining a number of occurrences of the defined cell in the data structure;

determining a flat resource value that would be obtained from executing a task by performing an operation on each component of each occurrence of the defined cell in the data structure;

determining a hierarchical resource value that would be obtained from executing the task by performing a first operation on each component of a single defined cell, and performing a second operation on each defined cell occurring in the data structure using results obtained from performing the first operation on each component of the single defined cell; and determining a hierarchical effectiveness of the defined cell by comparing the hierarchical resource value with the flat resource value.

2. The method recited in claim 1, further comprising:

determining the flat resource value to be a total number of operations performed on each elementary device of the data structure to execute the task; and determining the hierarchical resource value to be the total number of operations performed on the data structure to execute the task using the defined cell.

3. The method recited in claim 1, further comprising:

determining the flat resource value to be a total number of operations performed on the components of the task; and determining the hierarchical resource value to be a total number of first operations on the component of a single defined cell and a total number of second operations performed on the defined cells occurring in the data structure.

4. The method recited in claim 1, further comprising:

determining the hierarchical effectiveness of the defined cell to be the percentage of the hierarchical resource value relative to the flat resource value.

5. The method recited in claim 1, further comprising:

determining the hierarchical effectiveness of the defined cell as an absolute hierarchical effectiveness by defining the cell to include only elements of the data structure.

6. The method recited in claim 1, further comprising:

determining the hierarchical effectiveness of the defined cell as a cumulative hierarchical effectiveness by defining the cell to include at least one other cell of the data structure.

7. The method recited in claim 1, wherein criteria for defining the defined cell is provided with the data structure.

8. The method recited in claim 1, wherein the data structure is a data structure describing the structure of an electronic circuit.

9. The method recited in claim 8, wherein the data structure is a netlist listing.

10. The method recited in claim 8, further comprising using the hierarchical effectiveness of the defined cell to identify a matching cell in another data structure.

11. A method for selecting cells in a data structure upon which to perform operations for executing a task, comprising:

(A) defining a group of cells in a data structure;

(B) for all of the cells in the group,
(1) determining a number of occurrences of each cell in the data structure,
(2) determining the total cumulative resource value that would be obtained from executing a task by
(a) performing a component operation on each component of each cell in the group, and
(b) performing a cell operation on each cell in the group using results obtained from performing the component operation on each component of the cell;

(C) determining a cumulative hierarchical resource value for selected cells that would be obtained from executing a task by, for each selected cell,
(a) performing a component operation on each component of the cell, and
(b) performing a cell operation on each cell occurring in the data structure using results obtained from performing the component operation on each component of the cell, and;

(D) determining a savings value based upon a relationship between the total cumulative resource value and the cumulative hierarchical resource value for the selected cells;

(E) if the savings value is above a threshold value,
(1) determining, for each unselected cell in the group, a cumulative hierarchical effectiveness ranking that would be obtained from executing a task by
(a) performing a component operation on each component of the cell, and
(b) performing a cell operation on each cell occurring in the data structure using results obtained from performing the component operation on each component of the cell,
(2) selecting the cell having the highest cumulative hierarchical effectiveness ranking and repeating stops (C) through (E); and (F) executing the task using the selected cells.

12. The method recited in claim 11, further comprising:

determining the total cumulative resource value to be a total number of operations performed on the data structure to execute the task using each cell defined in the data structure; and determining the cumulative hierarchical resource value to be the total number of operation performed on the data structure to execute the task using the selected cells.

13. The method recited in claim 11, further comprising:

determining the cumulative hierarchical resource value to be the sum of, for the identified cell, a total number of first operations on each component of the identified cell, a total number of second operations performed on each occurrence of the identified cell occurring in the data structure, and for each occurrence of a selected cell, a total number of first operations on each component of the selected cell, and a total number of second operations performed on each occurrence of the selected cell occurring in the data structure.

14. The method recited in claim 11, further comprising:

determining the savings value according to the following formula savings value = 100 × [(cumulative hierarchical resource value − total cumulative resource value)/ cumulative hierarchical resource value].

15. The method recited in claim 11, wherein the data structure is a data structure describing the structure of an electronic circuit.

16. The method recited in claim 15, wherein the data structure is a netlist listing.

17. The method recited in claim 11, wherein criteria for defining the defined cell is provided with the data structure.

18. A computer-readable medium having computer-executable instructions for performing the method recited in claim 1.

19. The computer-readable medium recited in claim 18, having further computer-executable instructions for performing the method recited in claim 2.

20. The computer-readable medium recited in claim 18, having further computer-executable instructions for performing the method recited in claim 10.

21. A computer-readable medium having computer-executable instructions for performing the method recited in claim 11.

22. The computer-readable medium recited in claim 21, having further computer-executable instructions for performing the method recited in claim 12.

23. The computer-readable medium recited in claim 21, having further computer-executable instructions for performing the method recited in claim 13.

24. The computer-readable medium recited in claim 21, having further computer executable instructions for performing the method recited in claim 14.

* * * * *